Sept. 11, 1956

J. T. FISCHER

STABILIZED CASCADE-CONNECTED SEMI-CONDUCTOR AMPLIFIER CIRCUITS AND THE LIKE

Filed Nov. 15, 1952

2,762,875

INVENTOR

John T. Fischer

BY H. L. Newton

ATTORNEY 2,762,875

STABILIZED CASCADE-CONNECTED SEMI-CONDUCTOR AMPLIFIER CIRCUITS AND THE LIKE

John T. Fischer, Princeton, N. J., assignor to Radio Corporation of America, a corporation of Delaware Application November 15, 1952, Serial No. 320,671

5 Claims. (Cl. 179—171)

Figure 1:
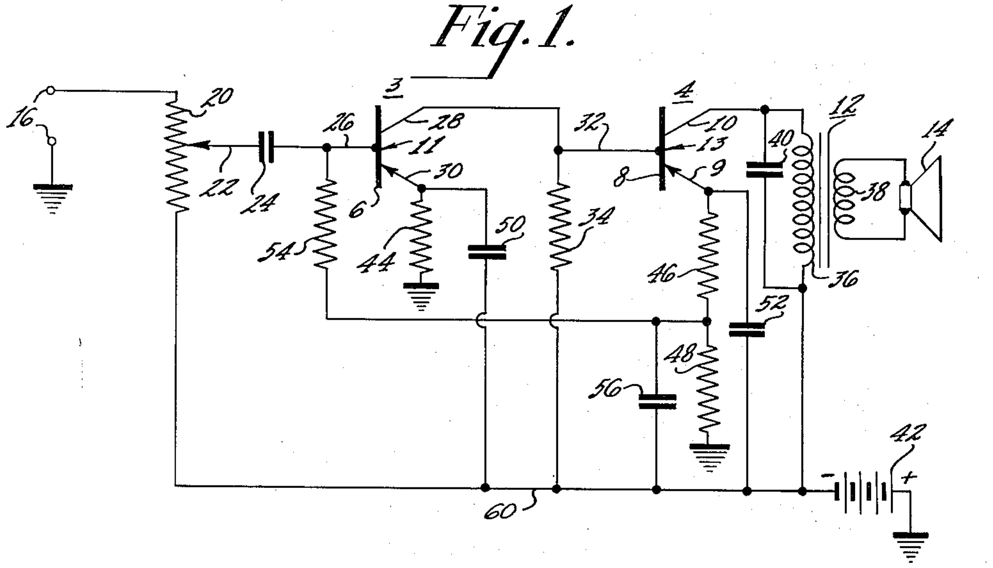

This invention relates in general to signal amplifying circuits and in particular to circuits of the type referred to employing semi-conductor devices connected in cascade relationship.

The recent development of commercially useful semi-conductor devices of the type employing a semi-conductive element having three contacting electrodes has already had a decided effect upon and has caused the introduction of many new techniques in the electronic signal communication field and more especially in the electronic amplification art. These devices, which are known extensively as "transistors," are small in size especially when compared with the ordinary vacuum tube, require no heater power, are very durable, and consist of materials which appear to have a long life.

Because of these advantages extensive efforts have been made to permit the efficient utilization of transistors in signal amplifier communication systems as above referred to. The transistor, while in many ways closely analagous to the vacuum or electronic tube, exhibits considerable and significant differences. Thus, in many instances, new techniques are needed for the most efficient application of the device in replacing or modifying known electronic tube systems, and this is of particular importance in the application of transistors in electronic-amplification circuits and systems of all types. Thus it has been found possible to directly connect transistors in cascade circuit relationship, thereby permitting the development of highly useful and efficient multistage transistor amplifier circuit units. Such circuits exhibit sufficiently high gain and a signal to noise ratio which is acceptable for most applications.

More particularly, considerable research has been undertaken in the development of transistor amplifier circuits suitable for use in radio signal receivers. Accordingly, the construction of superheterodyne radio receivers employing transistors as radio intermediate and audio frequency amplifier circuits has been found feasible.

The advantages of employing transistors in one or more stages of a radio receiver are readily apparent. Because of their comparatively small size transistors will occupy a relatively small space as compared to vacuum or electronic tubes. In addition, the elimination of all or most of the heater supply batteries will still further reduce the receiver space requirements, which is of particular importance in portable equipment. Besides these advantages it is contemplated that radio receivers employing transistors may be considerably more durable or rugged than the conventional receivers utilizing vacuum tubes. This is a distinct advantage, especially where the receiver is of the portable type as referred to above and subject to rather rough treatment. Because of their apparent long life, the replacement of transistors may be expected to be minimized. It has been found that these advantages may be attained without a reduction in performance qualities, and give promise for greater improvements in the future. Transistors normally are of two general classes which are known as the point-contact transistor and the junction transistor. Point contact transistors comprise, in general, a body of semi-conductive material, and three contacting electrodes which have been designated as the emitter electrode, the collector electrode, and the base electrode. The semi-conductive body may be either of the N or P type. If the body is of the N type the emitter electrode is normally biased positively or in a relatively conducting direction, and the collector electrode is biased negatively or in a relatively non-conducting direction with respect to the base electrode. If the body is of the P type the bias potentials are reversed.

The junction transistor on the other hand comprises, in general, a body of semi-conductive material having two zones of one conductivity type separated by and contiguous with a zone of the opposite conductivity type. Thus the device may be of either the N–P–N type or of the P–N–P type. If the transistor is of the N–P–N type the emitter electrode is generally connected to the negative terminal of a source of potential and the collector electrode to a positive source, each with respect to the base electrode. For the P–N–P type these polarities are reversed.

A number of circuit arrangements have been proposed for connecting together individual transistors of both the point contact and junction type to produce multi-stage amplification systems. One of these circuit arrangements comprises two or more P–N–P or N–P–N junction transistors connected in cascade relationship with their emitter electrodes connected to ground for signal frequency and their respective collector electrodes connected to a source of bias potential. The input signal may be applied to each stage between the base electrode and the emitter electrode and the output signal may be taken between the collector electrode and the emitter electrode. Thus the emitter electrode is common to both the input and output circuits. Coupling between the transistors is provided by connecting the collector electrode of one transistor to the base electrode of the succeeding transistor.

A circuit arrangement embodying the above principles is described and claimed in a copending application by Loy E. Barton, Serial No. 320,666, filed on November 15, 1952, and assigned to the same assignee as this application.

It is usual in signal amplifier and like systems employing two or more transistors connected in cascade relationship, to provide a single source of biasing potential, such as a battery. When P–N–P type transistors are provided in such systems, it is the general practice to connect the positive terminal of the battery to chassis ground and the negative terminal directly to the collector electrode circuit of each of the transistors. The emitter electrodes may be coupled through suitable biasing resistors to ground to provide a forward bias between the base electrode and the emitter electrode, and a reverse bias between the base electrode and collector electrode. For such a biasing arrangement, furthermore, it has been the usual practice to by-pass the emitter electrode biasing resistors with suitable capacitors. Thus a low impedance to ground is provided for signal frequencies.

Transistors are at present low impedance devices and as a result the internal impedance of the battery may serve as a coupling element between various portions of the circuit. It is for this reason that in cascade-coupled transistor circuits relatively high signal voltages may be developed across the battery which, if coupled through the internal impedance of the battery and fed back in proper phase may cause the circuit to oscillate.

In signal amplifier systems where a vacuum tube has been used in conjunction with one or more transistors, it has been found advantageous to use a single source of potential for both tube energization and transistor biasing purposes. This source of potential may have a negative terminal connected to ground and a positive terminal connected to the anode circuits of vacuum tubes and to the emitter electrode circuits of the transistors. It has been usual for such an application to by-pass the emitter electrode biasing resistors for signal frequencies with suitable capacitors connected between the emitter electrodes and the positive terminal of the source of potential.

As in the case of conventional biasing arrangements, it has been found that this latter arrangement may also cause the circuit to oscillate, particularly at the low frequencies. Here again these oscillations apparently result from a feedback signal which is developed across the internal impedance of the source of potential. Oscillations in an amplifier circuit are, of course, undesirable and although they may possibly be eliminated by suitable coupling networks or separate battery by-pass circuit arrangements, the extra circuit elements required are very often costly and introduce other disadvantages especially where size or weight is a consideration. It is accordingly, a principal object of the present invention to provide improved means for stabilizing signal amplifier and like circuits employing a plurality of semi-conductor devices connected in cascade relationship.

It is a further object of the present invention to provide improved means for preventing adverse feedback signals in amplifier and like circuits employing a plurality of direct-coupled transistors.

Still another object of the present invention is to provide means for preventing oscillations in direct-coupled transistor amplifier circuits wherein the number of circuit elements required is minimized.

These and further objects of the present invention are achieved by an improved circuit arrangement employing a plurality of cascade-coupled semi-conductor devices whereby both the emitter electrode biasing resistors and the impedance of the supply source are by-passed for signal frequencies. By eliminating the coupling effects of the battery impedance, unwanted oscillations are eliminated.

The desired operation may be accomplished, by way of example, by returning suitable by-pass networks to the negative terminal of the supply source for the arrangement wherein the positive terminal is at ground and the negative terminal is connected to the collector electrodes. For the case where the negative terminal of the supply source is at ground and the positive terminal is connected to the emitter electrodes, the by-pass networks are connected to ground. Thus in each instance both the emitter electrode biasing resistors and the potential source are by-passed, thereby preventing undesired feedback of signal energy which may cause the circuit to oscillate.

Figure 2:
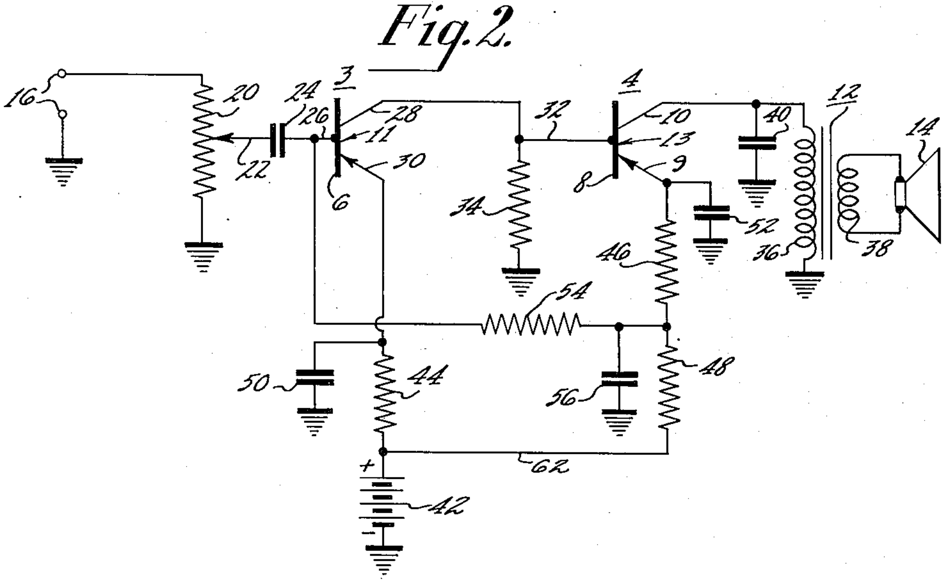

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Fig. 1 is a circuit diagram of the audio frequency amplifier section of a radio receiver embodying the present invention; and Fig. 2 is a modification of the circuit illustrated in Fig. 1, also embodying the present invention.

Referring now to the drawing wherein like elements are designated by like reference numerals in both the figures, and referring particularly to Fig. 1, the amplifier is of the two-stage type comprising in general, a first amplifying stage 3 and a second amplifying stage 4. Although the principles of the invention are equally applicable to more than two amplifier stages, the amplifier may as mentioned, be the audio amplifying section of a radio receiver, although it should be understood that the invention and its application are not restricted to audio amplifiers or to radio receivers generally. The amplifying stages utilize transistors 11 and 13 and having respectively semi-conductive bodies 6 and 8, and three contacting electrodes in each case. The body 6 has in contact therewith a base electrode 26, a collector electrode 28, and an emitter electrode 30, and the body 8 has in contact therewith a base electrode 32, a collector electrode 10, and an emitter electrode 9. These bodies and their electrodes will be referred to hereinafter as the driver transistor 11 and the output transistor 13.

The output transistor has the collector electrode 10 coupled through an output transformer 12 to a loud speaker 14 or other suitable load means. The driver and output transistors may be of the junction type and in the drawing are illustrated as being of the P–N–P junction type, although it should be understood that by reversing the biasing polarities an N–P–N type would work equally well.

The incoming signal, when applied to input terminals 16, is impressed upon the base electrode, that is, between the base electrode 26 and the emitter electrode 30 of the driver transistor 11. In order to provide volume control a potentiometer 20 having a variable tap 22 may be connected between the signal input terminals 16 and the electrodes referred to of the driver transistor 3. A coupling capacitor 24 is connected in circuit with the base electrode 26 to isolate the base electrode for biasing purposes. The collector electrode 28 of the driver transistor is directly coupled to the base electrode 32 of the output transistor 13 by means of resistor 34 having a relatively high impedance and which is connected between these electrodes and the negative bus 60, for purposes which will hereinafter be discussed. The amplified audio frequency signals appearing at the collector electrode 10 of the output transistor 13 may be applied to the load means 14, through suitable coupling means. To provide desired impedance matching, an output transformer 12 may be included as the coupling means. This has a secondary winding 38 connected to the load means and a primary winding 36 connected between the collector electrode 10 and ground. A capacitor 40 may be placed in shunt with the primary winding 36 to by-pass undesired high frequency signals.

As mentioned above, the bias potential between the base electrode and the emitter electrode of each of the transistors 11 and 13 may be in a forward direction and the bias between the collector electrode and the base electrode may be in a reverse direction. To this end, the positive terminal of a potential source or battery 42 is connected to ground and the negative terminal of the battery is connected to the collector electrode of each of the transistors through the common bus 60. Since each of the emitter electrodes is at ground potential they are biased positively with respect to the collector electrodes. The collector electrode 10 of the output transistor is connected through the primary winding 36 of the output transformer 12, to the negative bus. To connect the collector electrode 28 of the driver transistor to the negative source, a circuit including the common resistor 34 is connected from the collector electrode to the negative bus.

As in Barton, previously referred to, resistor 34 further provides a common impedance coupling means between the collector electrode 28 of the driver transistor 11 and the base electrode 32 of the output transistor 13. One end of the resistor 34 is returned to the negative bus 60 as explained above. Thus the resistor 34 provides collector electrode load impedance for the driver transistor, and in addition permits direct coupling of the driver transistor to the output transistor.

Further as in Barton, a feedback network is provided between the emitter electrode 9 of the output transistor to the base electrode 26 of the driver transistor. To this end two resistors 46 and 48 are connected in series between the emitter electrode 9 and ground. The junction of resistors 46 and 48 is connected through a coupling resistor 54 to the base electrode 26 of the driver transistor 11. This circuit arrangement provides self-adjusting biasing means. Assuming that a static condition exists in the circuit, the values of the resistors 34, 46 and 48 are so chosen that initially the base current drawn by the transistor 13 is excessive, with the result that the direct current flowing in the output collector electrode circuit will also be excessive. Any excess current in the output collector electrode circuit will also flow in the resistors 46 and 48 of the emitter electrode circuit, increasing the voltage drop across each of these resistors.

Because of the excess current through resistor 48 an excessively high bias potential in the forward direction will be applied between the base electrode 26 and the emitter electrode 30 of transistor 11. This causes additional collector current to flow through resistor 34. Because of the additional current through resistor 34, a voltage drop is produced across this resistor such that the base electrode 32 becomes more positive with respect to ground. In this manner the forward bias between the base electrode 32 and the emitter electrode 9 is reduced, thereby reducing the base bias current. This change in potential at the base of transistor 13 results in a decrease of the base-emitter bias of the transistor 13, with the result that the current through the resistors 46 and 48 is reduced and the base emitter bias of the transistor 11 is reduced. This, in turn, causes a reduction in the collector electrode current of the transistor 11, thereby reducing the voltage drop across the resistor 34. This action will continue and the final direct current in the output circuit of transistor 13 will depend upon the values of the various resistors used in the circuit. In this manner the bias potential applied to the transistor amplifier is self-adjusting.

It has hereinbefore been the practice to by-pass certain of the biasing resistors in transistor circuits wherein the negative terminal of the supply source is connected to the collector electrodes, with suitable by-pass capacitors which present a low impedance to ground for signal frequencies. In this manner, by way of example, suitable by-pass capacitors to ground may be placed across the biasing resistor 44 in the driver transistor emitter electrode circuit. In addition, further capacitors to ground may be placed across the resistors 46 and 48 in the output transistor emitter electrode circuit.

It has been found in many cases wherein biasing resistors are by-passed to ground at signal frequencies, that a signal amplifying circuit, for example, such as the one illustrated in Fig. 1, may oscillate or be affected otherwise adversely, particularly when the tap 22 of the volume control unit is adjusted to provide minimum resistance. Oscillations and like disturbances may be caused by a regenerative feedback signal developed across the direct current source of potential, such as the battery 42, and coupled to the amplifying stages through the internal impedance of the source.

In accordance with the present invention, means are provided for substantially eliminating these undesirable disturbances. By-pass means are provided for maintaining the base and emitter electrodes of each amplifier stage at substantially the same signal reference potential. In this manner any adverse signal energy that may be developed across the supply source is substantially prevented from inducing undesired oscillations of the amplifier circuit. To this end the by-pass capacitors 50, 56 and 52 shown in the embodiment of Fig. 1 are connected in shunt with the biasing resistors 44, 46 and 48 respectively, but instead of returning these capacitors to a point of ground potential as is conventional, they are returned, in accordance with the invention, to the negative terminal of the bias potential supply source 42.

It it is assumed for purposes of explaining the present invention that the usual by-pass arrangement was used in Fig. 1, the by-pass capacitors 50, 56 and 52 would be connected to a point on the circuit which would be at ground potential. Thus any signal developed across the battery 42, would be fed back through the negative bus 60 to the volume control resistor 20 and through the coupling capacitor 24 to the base electrode 26 of the driver transistor 11. Accordingly, the signal developed across the supply battery 42 would be impressed between the base electrode and the emitter electrode of the driver transistor. This results, in the conventional arrangement, because the emitter electrode by-pass capacitor is returned to ground. In this manner, a potential difference may exist between the base electrode 26 and the emitter electrode 30 which will cause the driver transistor to oscillate. These oscillations will appear in the output circuit of the driver transistor and hence across the input circuit of the output transistor.

Since the emitter electrode of the output transistor would also be at signal frequency ground, oscillatory signal energy appearing at the base electrode of the output transistor would create a variable potential between the base electrode and the emitter electrode. It is apparent, therefore, that signals developed across the internal impedance of the battery may cause the circuit to break into undesirable oscillations.

It is known that by placing a suitable by-pass capacitor directly across the supply source to ground, the currents flowing through the source creating the undesired feedback signal may, theoretically at least, be by-passed to ground at predetermined frequencies. Transistors are, however, relatively low input impedance devices. In addition, the undesired feedback signals may have frequencies which vary between considerable limits. To effectively by-pass the undesired signals in accordance with this known method therefore, particularly at the lower limits of this frequency range, a capacitor having a capacitance value which is very large may have to be placed across the supply source. This capacitance value may be so great as to make the use of such a capacitor impractical.

There is another disadvantage to this known by-pass arrangement, however, since it necessitates the use of an additional capacitor in the circuit. Aside from cost considerations this may be undesirable if it is realized that in many instances transistor circuits are preferred because of their small size. The number of circuit elements, of course, contribute to the size of the circuit structure, and any elimination of circuits elements is therefore desirable.

Another solution that may substantially prevent this adverse feedback of signal energy is the provision of a load impedance and blocking capacitors which are separate from the volume control resistor 20, which in the present invention serves the dual function of being both the load impedance and volume control resistor. In such a case the low signal end of the volume control resistor is returned to the positive terminal of the bias supply source. Since the emitter electrode of the driver transistor is also connected to the positive terminal of the battery, the unwanted signal developed across the battery does not create a potential difference between the base electrode and emitter electrode of the driver transistor and hence it will not break into oscillations. In this case, as in the case of by-passing the battery with a large capacitor, extra circuit elements are required at the expense of economy and the compactness and small size of the circuit embodying the present invention.

In accordance with the present invention, therefore, an improved circuit arrangement is provided wherein stabilization may be realized without the provision of additional circuit elements as above described. To this end the emitter and base electrodes of each transistor are placed at the same signal reference potential by coupling them to the negative terminal of the battery 42 through the bus 60 which is at the signal reference potential. Accordingly, the by-pass capacitor 50 which is placed across the emitter electrode biasing resistor 44 of the driver transistor is connected directly to the negative terminal of battery 42 through the bus 60. In a similar manner, the by-pass capacitors 52 and 56 which are placed across the biasing resistors 46 and 48 respectively, in the emitter electrode circuit of the output transistor, are connected directly to the negative terminal of the battery 42.

It can be shown that the arrangement of by-pass capacitors as above-described and illustrated in Fig. 1 of the drawing will effectively eliminate the adverse disturbances hereinbefore mentioned. Assume, for example, that a signal is developed across the battery 42 due to current flowing in the emitter and collector electrode circuits of the output transistor. This signal, will, because of the by-pass arrangement, effectively be applied between the base and emitter electrodes of the driver transistor 11. Hence these electrodes will be placed at the same signal reference potential. Since there will effectively be no potential difference between the emitter electrode 30 and the base electrode 26 due to the signals developed across the battery 42, oscillation of the driver transistor is effectively precluded.

In a similar manner, the by-pass capacitor 52 in the emitter electrode circuit of the output transistor 13 presents a low impedance path to any signals that may be developed across the battery 42. In this manner this signal is applied between the base electrode 32 and the emitter electrode 9 of the output transistors. Since as in the case of the driver transistor, no potential difference exists between the base electrode and emitter electrode of the output transistor due to signals developed across the battery 42, oscillations are prevented in this portion of the circuit. It is in this manner that circuit oscillations which may result from feedback of adverse signals due to the coupling effects of the internal impedance of the supply source are substantially eliminated.

It was previously explained that transistors often find utility in circuit arrangements employing one or more vacuum or electronic tubes. It is desirable for such applications that a single supply source be used for both transistor biasing potentials and tube energization. It is for this reason that the supply source may have its negative terminal grounded and its positive terminal connected to the emitter electrodes of the transistors. A circuit having this provision and embodying the present invention is illustrated in Fig. 2 of the drawing.

The circuit illustrated in Fig. 2 is in general, identical with the circuit illustrated in Fig. 1. Thus a two stage amplifier is illustrated having a first amplifying stage 3 and a second amplifying stage 4. Each of the amplifying stages utilizes a semi-conductive body 6 or 8 having three contacting electrodes. The body 6 has a base electrode 26, a collector electrode 28 and an emitter electrode 30, and the body 8 has a base electrode 32, a collector electrode 10, and an emitter electrode 9. The output transistor has the collector electrode 10 coupled through an output transformer 12 to a loud speaker 14 or other suitable load means. As in the case of Fig. 1 the driver and output transistors, 11 and 13 respectively, may be of the junction type and in the circuit illustrated in Fig. 2 are shown as being of the P-N-P junction type, although it should be understood that by reversing the biasing polarities an N-P-N type would work equally well.

The circuit illustrated in Fig. 2 also embodies the direct coupling arrangement and biasing network illustrated in Fig. 1 and hereinbefore described. Thus a common coupling resistor 34 is provided between the collector electrode 28 of the driver transistor and the base electrode 32 of the output transistor. In a similar manner a feedback network comprising the resistors 46 and 48 and a connection including the resistor 54 from the junction of resistors 46 and 48 to the base electrode 26, is provided. This network provides self-adjusting biasing potentials as described for the circuit illustrated in Fig. 1.

In a system employing direct-coupled transistors wherein the positive terminal of the supply source is connected directly to the emitter electrodes of the transistors, it has been conventional to connect the by-pass capacitors across the emitter electrode biasing resistors to the positive terminal of the battery. Thus if the conventional by-passing arrangement had been illustrated in Fig. 2 the capacitors 50, 52, and 56 would be returned to the positive bus 62.

It has been found, however, that the conventional by-pass arrangement in this case, may not prevent undesired circuit oscillations for much the same reasons as those already explained for Fig. 1 when the conventional by-pass arrangement is used. Thus it can be seen that a signal developed across the battery 42 will be coupled through the internal impedance of the battery to the emitter electrode 30 when the capacitor is conventionally connected to the positive terminal of the battery. As the tap 22 is moved toward the negative end of the volume control resistor 20, however, the collector electrode will substantially be at signal ground potential. Thus a potential difference due to the signal developed across battery 42 may exist between the base and emitter electrodes of the driving transistor, which may cause the circuit to oscillate.

In accordance with the present invention, this difficulty is substantially eliminated by connecting the capacitors 50, 52 and 56 to ground as shown in the embodiment of the invention illustrated in Fig. 2. By connecting these capacitors to ground, the emitter electrodes remain at substantially signal frequency ground. Accordingly, as the tap 22 is moved toward the negative end of the resistor 22 the possibility of oscillations is considerably reduced, since the base electrode and emitter electrode of the driver transistor are then both at substantially the same reference potential (i. e. signal ground). It is in this manner that the principles of the invention find application in systems using both transistors and vacuum or electronic tubes with a single source of operating potential having a positive output terminal or terminals above ground potential for the system.

While it may be understood that the circuit specifications in accordance with the invention may vary with the design for any particular application, the following circuit specifications are included, by way of example only as being suitable for the circuits shown:

| | | |
|---|---|---|
| Capacitor 24 | microfarads | 10 |
| Capacitor 40 | do | .005 |
| Capacitor 50 | do | 25 |
| Capacitor 52 | do | 25 |
| Capacitor 56 | do | 25 |
| Resistor 20 | ohms | 10,000 |
| Resistor 34 | do | 18,000 |
| Resistor 44 | do | 560 |
| Resistor 46 | do | 56 |
| Resistor 48 | do | 100 |
| Resistor 54 | do | 5,600 |

Semi-conductor amplifier circuits and the like, wherein means, in accordance with the invention, are provided for stabilizing the circuits and preventing undesired and adverse feedback of signal energy may have many uses and applications. Circuits so constructed, in addition to being reliable, utilize a minimum of circuit elements, thus achieving the further advantage of economy of space and low cost.

What is claimed is:

1. A semi-conductor amplifier circuit comprising a first and a second semi-conductor device each comprising a semi-conductive body and a base electrode, a collector electrode, and an emitter electrode, means directly coupling the collector electrode of said first device to the base electrode of said second device, means including a source of potential having a pair of terminals and connected to provide operating bias for said devices, load impedance means connecting the collector of said second device with one terminal of said source, a first resistor connected in series between the emitter electrode of said first device and the other terminal of said source, a second and a third resistor connected in series between the emitter electrode of said second semi-conductor device and said other terminal of said source, direct-current conductive feedback means connected from the junction of said second and third resistors to the base electrode of said first device, a first by-pass capacitor connected between the emitter electrode of said first device and said one terminal of said source of potential for by-passing said first resistor and said source, a second capacitor connected between the emitter electrode of said second device and said one terminal of said source of potential for by-passing said second and third resistors and said source, and a third capacitor connected between the junction of said second and third resistors and said one terminal of said source of potential, said capacitors presenting a low impedance to signal frequencies whereby said circuit is stabilized over substantially the entire range of operating frequencies.

2. A semi-conductor signal amplifier circuit comprising a first and a second semi-conductor signal amplifying stage connected in cascade relationship, each of said stages including a semi-conductor device having an input electrode, an output electrode, and a common electrode, means providing a direct current conductive connection between the output electrode of said first signal amplifying stage semi-conductor device and the input electrode of said second semi-conductor device, means providing a source of biasing potential having impedance for said semi-conductor devices and including a pair of terminals, a first direct current conductive impedance means connecting the common electrode of the semi-conductor device of said first stage with one of said terminals, second direct current conductive impedance means connecting the common electrode of the semi-conductor device of said second stage with said one terminal, a first and a second load impedance element connecting each of said output electrodes to the other terminal of said source, said second load impedance element providing an output circuit for said signal amplifier circuit, signal conveying means coupling said source of biasing potential to the input electrode of said first signal amplifying stage semi-conductor device, a first by-pass capacitor connected from the junction of said first impedance means and the common electrode of the semi-conductor device of said first stage to the other terminal of said source, and a second by-pass capacitor connected from the junction of said second impedance means and the common electrode of the semi-conductor device of said second stage to the other terminal of said source, said first and second capacitors being effective to by-pass said source and each of said impedance means to prevent signal feedback to the input electrode of said first signal amplifying stage semi-conductor device across the impedance of said source.

3. A semi-conductor circuit comprising a first and a second direct-coupled semi-conductor device each comprising a semi-conductive body and a base electrode, a collector electrode, and an emitter electrode in contact therewith, means providing a direct current conductive connection between the collector electrode of said first semi-conductor device and the base electrode of said second semi-conductor device, means including a source of potential having impedance and a pair of terminals and operative to bias each of the emitter and the respective base electrodes in a relatively conducting direction and each of the collector electrodes and the respective base electrodes in a relatively non-conducting direction, biasing resistors serially connected respectively between each of said emitter electrodes and one terminal of said source, load impedance means connected respectively between each of the collector electrodes and the other terminal of said source, signal conveying means coupling the other terminal of said source with the base electrode of said first semi-conductor device, and by-pass capacitors connected respectively from the junction of each of said emitter electrodes and said biasing resistors to the other terminal of said source for by-passing each of said resistors and said source to prevent signal feedback to the input electrode of said first device across the impedance of said source.

4. A semi-conductor amplifier circuit comprising a first and a second semi-conductor device each comprising a semi-conductive body and a base electrode, a collector electrode, and an emitter electrode in contact therewith, means for applying an input signal to the base electrode of said first device, means for deriving an output signal from the collector electrode of said second device, means providing a direct current conductive connection between the collector electrode of said device and the base electrode of said second device, a first resistor connected in series with the emitter electrode of said first device and a second resistor connected in series with the emitter electrode of said second device, a battery having impedance connected between said first resistor and a point of fixed potential and between said second resistor and a point of fixed potential, means coupling said battery with the base electrode of said first semi-conductor device, a first by-pass capacitor connected between the emitter electrode of said first device and the negative terminal of said battery to by-pass said first resistor and said battery for signal frequencies, and a second by-pass capacitor connected between the emitter electrode of said second device and the negative terminal of said battery to by-pass said second resistor and said battery for signal frequencies, said first and second by-pass capacitors being effective to prevent regenerative signal feedback to the base electrode of said first device across the impedance of said battery for eliminating undesired oscillations of said amplifier circuit.

5. A semi-conductor amplifier circuit comprising, in combination, a first and a second transistor each including a base electrode, a collector electrode, and an emitter electrode, means providing a direct current conductive connection between the collector electrode of said first transistor and the base electrode of said second transistor, means including a source of potential having a pair of terminals and connected to provide operating bias for said devices, load impedance means connecting the collector of said second device with one terminal of said source, a first resistor connected in series between the emitter electrode of said first device and the other terminal of said source, a second resistor connected in series between the emitter electrode of said second transistor and said other terminal of said source, means coupling said one terminal of said source with the base electrode of said first transistor, a first by-pass capacitor connected between the emitter electrode of said first device and said one terminal of said source of potential for by-passing said first resistor and said source, and a second by-pass capacitor connected between the emitter electrode of said second device and said one terminal of said source of potential for by-passing said second resistor and said source, said first and second capacitors being effective to prevent signal feedback to the base electrode of said first transistor across the impedance of said source.

References Cited in the file of this patent

UNITED STATES PATENTS

| | | |
|---|---|---|
| 2,531,076 | Moore | Nov. 21, 1950 |
| 2,541,322 | Barney | Feb. 13, 1951 |
| 2,647,957 | Mallinckrodt | Aug. 4, 1953 |
| 2,666,817 | Raisbeck et al. | Jan. 19, 1954 |

OTHER REFERENCES

Bell text, "The Transistor," pages 346–347, 365, 367, 370, publ. 1951 by Bell Tel. Labs., N. Y.